US008422321B2

(12) United States Patent
Tahara

(10) Patent No.: US 8,422,321 B2

(45) Date of Patent: Apr. 16, 2013

(54) SEMICONDUCTOR MEMORY DEVICE HAVING REGULAR AREA AND SPARE AREA

(75) Inventor: Kaoru Tahara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 83 days.

(21) Appl. No.: 12/929,483

(22) Filed: Jan. 28, 2011

(65) Prior Publication Data

US 2011/0188332 A1 Aug. 4, 2011

(30) Foreign Application Priority Data

Jan. 29, 2010 (JP) ................................. 2010-019280

(51) Int. Cl.
*G11C 8/12* (2006.01)

(52) U.S. Cl.
USPC ..................................... 365/200; 365/230.03

(58) Field of Classification Search .................... 365/96, 365/200, 201, 230.03
See application file for complete search history.

(56) References Cited

U.S. PATENT DOCUMENTS 4,459,685 A * 7/1984 Sud et al. ...................... 365/200
5,034,925 A * 7/1991 Kato ............................ 365/200
5,227,997 A * 7/1993 Kikuda et al. ........... 365/189.08
5,268,866 A * 12/1993 Feng et al. .................... 365/200
5,475,648 A * 12/1995 Fujiwara .................. 365/230.06
6,172,935 B1 * 1/2001 Wright et al. .............. 365/233.1
6,501,700 B2 * 12/2002 Pascucci .................. 365/230.04
2002/0054537 A1 * 5/2002 Pascucci ....................... 365/236
2002/0097626 A1 * 7/2002 Hidaka ......................... 365/222
2003/0123320 A1 * 7/2003 Wright et al. ................ 365/233
2008/0068918 A1 3/2008 Nishioka
2008/0179707 A1 7/2008 Ogawa

FOREIGN PATENT DOCUMENTS

JP 2008-71407 A 3/2008
JP 2008-186847 A 8/2008

* cited by examiner

*Primary Examiner* — Douglas King

(74) *Attorney, Agent, or Firm* — McGinn IP Law Group, PLLC

(57) ABSTRACT

Memory arrays ARY0 and ARY1 each include a regular area 108 and spare area 110. Fuse circuits FS0 and FS1 each store a relief address. Relief determination circuits RJ0 and RJ1 are provided so as to correspond to the fuse circuits FS0 and FS1, respectively. The relief determination circuits RJ0 and RJ1 each determine whether a designation address is the relief address or not. An access control circuit AC specifies an access destination from the memory array ARY0 or ARY1 according to the determination results. When it is determined by the relief determination circuit RJ0 that the designation address corresponds to the relief address, the access control circuit AC selects one of the memory arrays ARY0 and ARY1 according to CX13T<1:0> and selects the spare area 110 included in the selected memory array ARY as an access target.

14 Claims, 10 Drawing Sheets

114
CX13T<0>
TMFLGT
CX13B<0>
RJ0
RELIEF DETERMINATION CIRCUIT
CREDT<0>
LC0
CL0<9:3>
LATCH CIRCUIT
FS0
CF0<9:3>
FUSE CIRCUIT
FS1
FUSE CIRCUIT
LC1
CF1<9:3>
LATCH CIRCUIT
RJ1
CL1<9:3>
RELIEF DETERMINATION CIRCUIT
CREDT<1>
116
118
CX13B<1>
CX13T<1>
CAD<9:3>
CX13T<1:0>
ARY0
YDEC0
108
110
PD0
ARY1
100
YDEC1
108
110
PD1
ACCESS CONTROL CIRCUIT
AC

B

SEMICONDUCTOR MEMORY DEVICE HAVING REGULAR AREA AND SPARE AREA

BACKGROUND OF THE INVENTION

1. Field of the Invention

The present invention relates to a semiconductor memory device and, more particularly, to a semiconductor memory device having an access control circuit for accessing a relief address.

2. Description of Related Art

In a semiconductor memory device such as a DRAM (Dynamic Random Access Memory), the number of memory cells (hereinafter referred to as "defective cell") that do not operate properly is increased with an increase in a memory capacity. To cope with this problem, spare memory cells called "redundant cells" are prepared in such a semiconductor memory device, and the defective cell is replaced by the redundant cell so as to relieve the memory address of the defective cell. Hereinafter, the address of the defective cell is referred to as "relief address". Detection of the defective cell and replacement of the detected defective cell by the redundant cell are performed in a wafer state of the semiconductor device at the manufacturing time thereof. Specifically, the defective cell is detected in an operation test performed in a wafer state, and the relief address of the defective cell is recorded in a relief address storing area provided in the semiconductor memory device. When the defective cell is designated as an access destination, the actual access destination is a redundant cell designated by a relief address corresponding to the address of the defective cell.

As a device for storing the relief address designating the redundant cell, a fuse element which is a non-volatile memory device is often used. The fuse element is electrically conductive at its initial state and, is changed to a non-conductive state (insulated state) upon interruption of the electrical path due to laser beam irradiation. Information corresponding to one bit can be expressed by the conductive/non-conductive states of the fuse element. Thus, by selectively irradiating each of a plurality of fuse elements with laser beam, it is possible to program a desired relief address in a non-volatile manner (Japanese Patent Application Laid-Open Nos. 2008-071407 and 2008-186847). The recording processing of the relief address is generally referred to as "trimming" or "programming".

FIG. 9 is a schematic view illustrating the relationship between a bank and a relief address storing area in a general DRAM. The DRAM illustrated in FIG. 9 is assumed to have eight banks B0 to B7 each serving as a memory. Each bank includes a memory area 100 and a relief address storing area 106. The memory area 100 includes a regular area 108 and a spare area 110. The regular area 108 includes an array of regular memory cells (hereinafter, referred to as "regular cell"). In general, the regular cell includes not only normal memory cells (hereinafter, referred to as "normal cell") but also any defective cell.

The spare area 110 includes an array of the redundant cells. An access to the defective address is replaced by an access to the redundant cell. The address (relief address) of the defective cell is recorded in the relief address storing area 106. The relief address storing area 106 includes a first relief address storing area 102 and a second relief address storing area 104. The first relief address storing area 102 corresponds to the lower side of the address range of the regular cells, and the second relief address storing area 104 corresponds to the upper side thereof. For example, assuming that the address range of the bank B0 is 0 to 8191, the relief address included in 0 to 4095 (lower address side) is recorded in the first relief address storing area 102, and relief address included in 4096 to 8191 (upper address side) is recorded in the second relief address storing area 104.

FIG. 10 is an enlarged view of the relief address storing area 106 illustrated in FIG. 9. The relief address storing area 106 (first relief address storing area 102 and second relief address storing area 104) includes a plurality of fuse elements F. One fuse element F corresponds to one bit. The relief address is stored in a non-volatile manner by interruption/non-interruption of the fuse element F. In the trimming, laser beam is irradiated along a scan line SL1 along which fuse elements F10 to F14 are arranged to selectively interrupt the electrical path. In the example of FIG. 10, only the fuse element F12 on the scan line SL1 is interrupted. The same procedure is carried out for the scan lines SL2 to SL6 to selectively interrupt the fuse element F. In the case of FIG. 10, six scan operations for the scan lines SL1 to SL6 are required in the trimming.

In the initial stage of development of a processing technique, optimization is insufficient and therefore the defective cell tends to occur, so that it is necessary to previously mount a large number of fuse elements F. Accordingly, in the initial stage of the development, i.e., at the stage when a large number of fuse elements F are subjected to interruption, a long time is required for the trimming. As a processing technique becomes stable, the number of the defective cells decreases. However, even if the number of fuse elements F to be interrupted decreases, if there exists even only one fuse element F to be interrupted on each scan line SL, scan operation for the relevant scan line SL cannot be omitted. Thus, in the case of the above example, six scan operations are required regardless of the number of the fuse elements F. The time required for the scan occupies most of the trimming time, so that the virtual trimming time hardly reduced. That is, the number of times of scan operation gives greater influence on the trimming time than the number of times of interruption does. It follows that when the fuse elements F to be interrupted are sparsely populated, the number of times of interruption itself is reduced, while the number of times of scan operation is hardly reduced, and the present inventor has recognized this fact makes it difficult to reduce the trimming time after a processing technique has become stable.

SUMMARY

In one embodiment, there is provided a semiconductor memory device comprising: first and second memory areas each including a regular area and a spare area, the spare area being accessed in place of the regular area when an input address is a relief address; first and second relief address storing areas each storing the relief address; first and second relief determination circuits assigned to the first and second relief address storing areas, respectively and each determine whether the input address is the relief address or not; and an access control circuit that selects one of the first and second memory areas based on an area selection signal and selects the spare area included in the selected memory area as an access target when the first relief determination circuit determines that the input address is the relief address.

According to the present invention, when the number of addresses to be relieved is small, only one of a plurality of relief address storing area is used to store the relief address for relief of a defective cell, thereby reducing trimming time of the semiconductor memory device.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
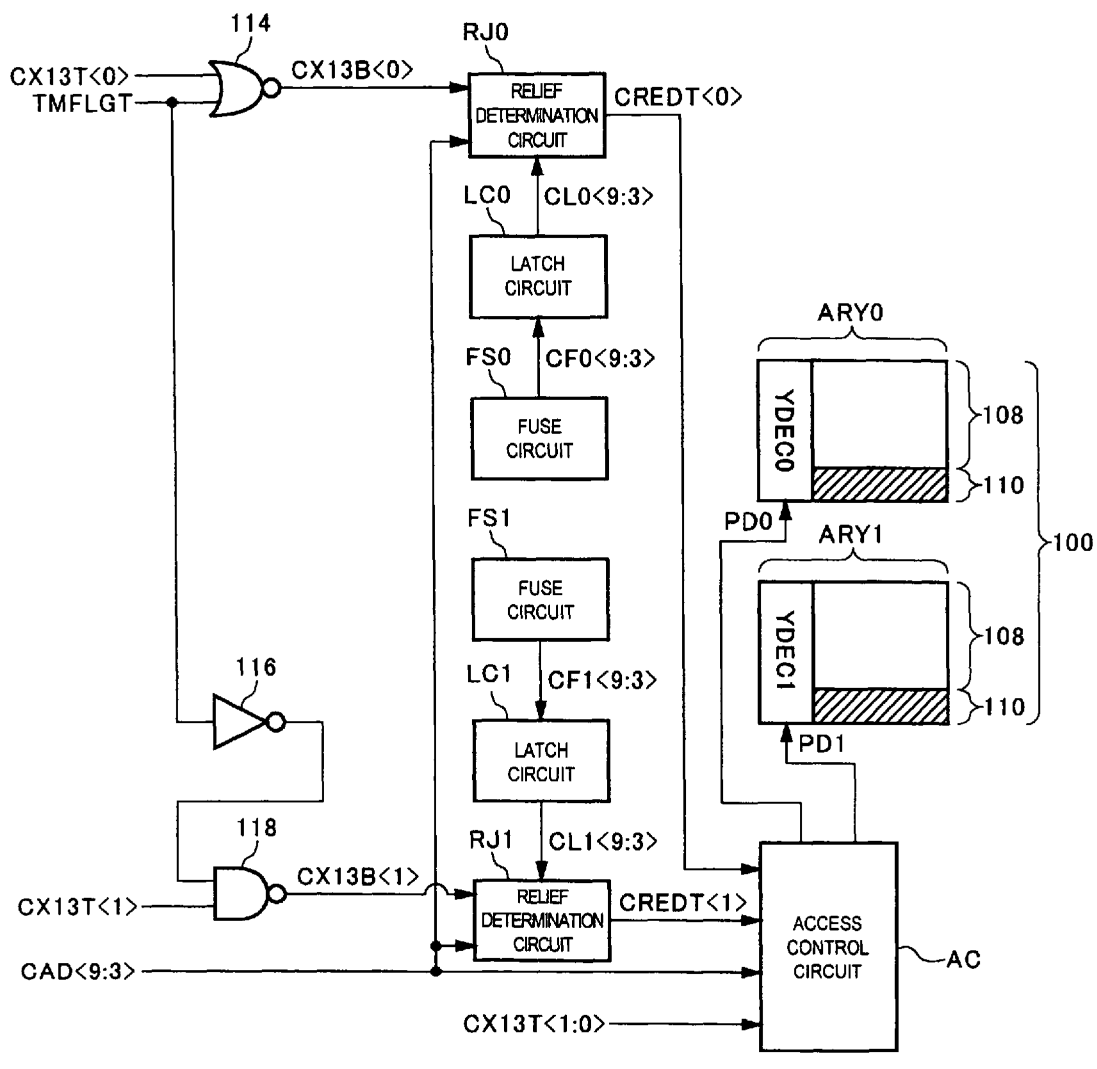
FIG. 1 is a peripheral circuit diagram of a bank of a semiconductor memory device according to a first embodiment of the present invention.

FIG. 1 is a peripheral circuit diagram of a bank B of a semiconductor memory device 10 according to a first embodiment of the present invention. A description will be given of a circuit configuration of the bank B first and then operation thereof. The circuit illustrated in FIG. 1 is housed in one bank B. A memory area 100 of the bank B is roughly divided into a lower address side memory array ARY0 (first memory area) and an upper address side memory array ARY1 (second memory area). In the present embodiment, it is assumed that the bank have an address width of 13 bits and that an address whose most significant bit (X=13) is 0 correspond to the memory array ARY0 and address whose most significant bit (X=13) is 1 correspond to the memory array ARY1.

The memory arrays ARY0 and ARY1 each include a regular area 108 and a spare area 110 and have, respectively, Y decoder YDEC0 and a Y decoder YDEC1 for selecting a column address. The Y decoders YDEC0 and YDEC1 are controlled by pre-decode signals PD0 and PD1 of an access control circuit AC, respectively.

Figure 2:
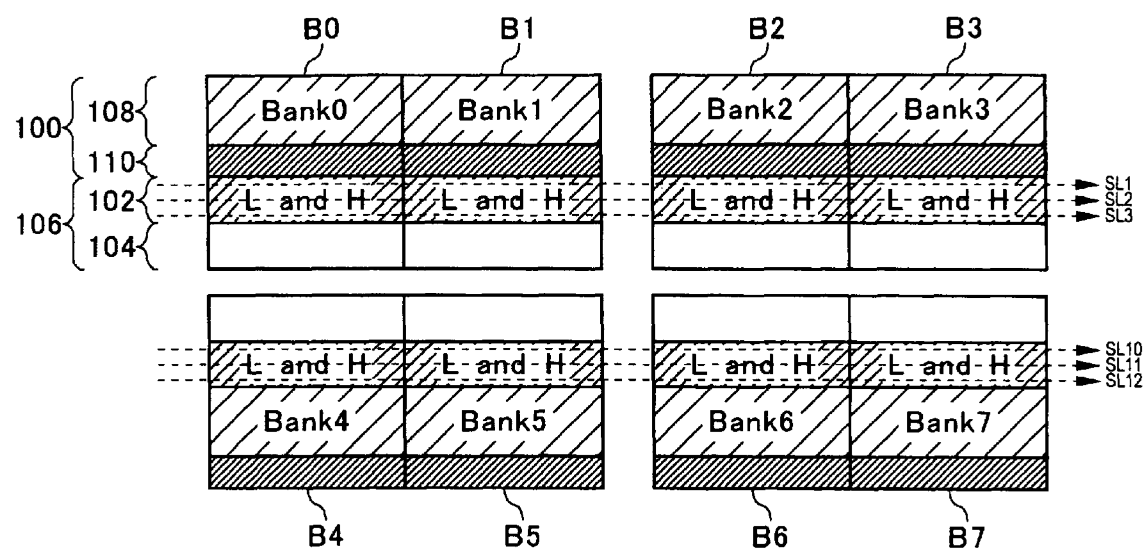
FIG. 2 is a first schematic view illustrating the relationship between the bank and a relief address storing area in the first embodiment.

Fuse circuits FS0 and FS1 are circuits corresponding to a first relief address storing area 102 and a second relief address storing area 104 of, e.g., a bank 0 illustrated in FIG. 2 and each include a plurality of fuse elements F for storing relief addresses. The fuse circuits FS0 and FS1 are separated from each other through a common discharge line. The fuse circuit FS0 stores the relief address. The relief address is output as a data signal CF0<9:3> and retained in a latch circuit LC0. Bits "H" and "L" included in the CF0<9:3> correspond to an interrupted fuse element and a non-interrupted fuse element, respectively. The latch circuit LC0 retains the CF0<9:3> and outputs it to a relief determination circuit RJ0 as CL0<9:3>.

The fuse circuit FS1 operates in the same manner as the fuse circuit FS0. CF1<9:3> which is a data signal of the fuse circuit FS1 is retained in a latch circuit LC1. As in the CL0<9:3>, bits "H" and "L" included in the CF1<9:3> correspond to an interrupted fuse element and a non-interrupted fuse element, respectively. The latch circuit LC1 retains the CF1<9:3> and outputs it to a relief determination circuit RJ1 as CL1<9:3>.

An external signal CX13T<1:0> input to the access control circuit AC is a two-bit signal indicating the most significant bit (X=13) of an address (hereinafter, referred to as "designation address") designated as an access destination. In the case where the designation address (column address) is included in the memory array ARY0 (lower address side), the CX13T<0> and CX13T<1> are set to "H" and "L", respectively, and in the case where the designation address is included in the memory array ARY1 (upper address side), the CX13T<0> and CX13T<1> are set to "L" and "H", respectively. The access control circuit AC recognizes whether the access destination is the memory array ARY0 or memory array ARY1 based on the CX13T<1:0>. As described above, the CX13T<1:0> functions an "area selection signal" that designates the memory array ARY0 or memory array ARY1 as the access destination.

The CX13T<0> signal is input also to a two-input NOR circuit 114. Another input signal of the NOR circuit 114 is a one-bit TMFLGT signal. Although details will be described later, when the TMFLGT signal is "L", an output signal CX13B<0> of the NOR circuit 114 is an inversion signal of the CX13T<0>.

The CX13T<1> signal is input also to a two-input NAND circuit 118. Another input signal of the NAND circuit 118 is an inversion signal of the TMFLGT signal generated by an inverter 116. When the TMFLGT signal is "L", an output signal CX13B<1> of the NAND circuit 118 is an inversion signal of the CX13T<1>.

The relief determination circuit RJ0 is a low-active circuit activated when the CX13B<0> is "L" and determines coincidence/non-coincidence between the CL0<9:3> and CAD<9:3>. The CAD<9:3> is a signal corresponding to a column address Y9-Y3 of the designation address. When all the bits coincide between the CAD<9:3> and CL0<9:3>, that is, when the designation address corresponds to any relief address recorded in the fuse circuit FS0, the relief determination circuit RJ0 outputs CREDT<0>="H" while when the designation address corresponds to none of the relief addresses recorded in the fuse circuit FS0, the relief determination circuit RJ0 outputs CREDT<0>="L".

The relief determination circuit RJ1 is a low-active circuit activated when the CX13B<1> is "L" and determines coincidence/non-coincidence between the CL1<9:3> and CAD<9:3>. When the designation address corresponds to any relief address recorded in the fuse circuit FS1, the relief determination circuit RJ1 outputs CREDT<1>="H" while when the designation address corresponds to none of the relief addresses recorded in the fuse circuit FS1, the relief determination circuit RJ1 outputs CREDT<1>="L".

The CREDT<0>, CREDT<1>, CAD<9:3>, and CX13T<1:0> are input to the access control circuit AC. The access control circuit AC recognizes the destination address (column address) and access memory array ARY based on the CAD<9:3> and CX13T<1:0>. Further, the access control circuit AC selects one of the regular area 108 and spare area 110 based on the CREDT<0> or CREDT<1>.

The number of defective cells increases in the initial stage of the development of a processing technique and, accordingly, the number of relief addresses increases, so that the TMFLGT is set to "L". At this time, the relief addresses are sorted into the fuse circuits FS0 and FS1. When the number of the relief addresses decreases as the processing technique becomes stable, all relief addresses are recorded only in the fuse circuit FS0 while the fuse circuit FS1 is not used. At this time, the TMFLGT is set to "H".

Based on the circuit configuration described above, a concrete relief address control method will be described below.

(1) In the Case Where the Number of Relief Addresses is More than a Predetermined Value In the case where the number of defective cells detected in an inspection performed in a wafer state is more than a predetermined value, the detected relief addresses are stored in the fuse circuits FS0 and FS1. That is, the lower-address side relief address is recorded in the fuse circuit FS0, and upper-address side relief address is recorded in the fuse circuit FS1. At this time, the TMFLGT is set to "L". The "predetermined value" mentioned here may be defined as a threshold at which further relief address in the fuse circuit FS0 cannot be written.

Since the TMFLGT is set to "L", the relief determination circuit RJ0 is activated when the CX13T<0> is set to "H", that is, when the memory array ARY0 is designated. On the other hand, the relief determination circuit RJ1 is activated when the CX13T<1> is set to "H", that is, when the memory array ARY1 is designated. Thus, when either one of the relief determination circuits RJ0 and RJ1 is activated, the other one is necessarily inactivated.

1-1: When the Designation Address is Lower Address (CX13T<0>="H", CX13T<1>="L")

At this time, the memory array ARY0 is selected, and the relief determination circuit RJ0 is activated while the relief determination circuit RJ1 is inactivated. Therefore, the output of the relief determination circuit RJ1 is fixed to CREDT<1>="L". When the designation address is the relief address, the CREDT<0> is set to "H". When the designation address is not the relief address but a normal address, the CREDT<0> is set to "L".

The access control circuit AC outputs, according to the CAD<9:3> and CX13T<1:0>, the pre-decode signal PD0 that designates the regular area 108 of the memory array ARY0 as an access target, in case of the CREDT<0> is "L". When the CREDT<0> is "H", the access control circuit AC outputs the pre-decode signal PD0 that designates the spare area 110 of the memory array ARY0 as an access target.

1-2: When the Designation Address is Upper Address (CX13T<0>="L", CX13T<1>="H")

At this time, the memory array ARY1 is selected, and the relief determination circuit RJ0 is inactivated while the relief determination circuit RJ1 is activated. Therefore, the output of the relief determination circuit RJ0 is fixed to CREDT<0>="L". When the designation address is the relief address, the CREDT<1> is set to "H". When the designation address is not the relief address but a normal address, the CREDT<1> is set to "L".

The access control circuit AC outputs the pre-decode signal PD1 that designates the regular area 108 of the memory array ARY1 as an access target, in case of the CREDT<1> is "L". When the CREDT<1> is "H", the access control circuit AC outputs the pre-decode signal PD0 that designates the spare area 110 of the memory array ARY1 as an access target.

(2) In the Case Where the Number of Relief Addresses is Not More Than a Predetermined Value In the case where the number of defective cells is not more than a predetermined value, the detected relief addresses are recorded only in the fuse circuit FS0. The "not more than a predetermined value" mentioned here refers to not more than the maximum number of the defective cells that can be stored only in the fuse circuit FS0. The TMFLGT is set to "H". Since the TMFLGT is set to "H", the relief determination circuit RJ0 is activated irrespective of the value of the CX13T<1:0>, while the relief determination circuit RJ1 is inactivated. Therefore, the CREDT<1> is fixed to "L".

2-1: When the Designation Address is Lower Address (CX13T<0>="H", CX13T<1>="L")

The access control circuit AC selects the memory array ARY0 according to CX13T<1:0>. When the designation address is the relief address, the CREDT<0> is set to "H". When the designation address is not the relief address but a normal address, the CREDT<0> is set to "L".

The access control circuit AC outputs, according to the CAD<9:3> and CX13T<1:0>, the pre-decode signal PD0 that designates the regular area 108 of the memory array ARY0 as an access target when the CREDT<0> is "L". When the CREDT<0> is "H", the access control circuit AC outputs the pre-decode signal PD0 that designates the spare area 110 of the memory array ARY0 as an access target.

2-2: When the Designation Address is Upper Address (CX13T<0>="L", CX13T<1>="H")

The relief determination circuit RJ0 compares the designation address CAD<9:3> included in the upper address side and relief address CL0<9:3> output from the fuse circuit FS0. Since the relief addresses included not only in the lower address side but also in the upper address side are recorded in the fuse circuit FS0, the relief determination circuit RJ0 can determine coincidence/non-coincidence between the designation address and relief address in terms of the upper address side. When the designation address (upper address) is the relief address, the CREDT<0> is set to "H". When the designation address is not the relief address but a normal address, the CREDT<1> is set to "L".

The access control circuit AC selects the memory array ARY1 according to the CX13T<1:0>. The access control circuit AC outputs the pre-decode signal PD1 that designates the regular area 108 of the memory array ARY1 as an access target when the CREDT<0> is "L". When the CREDT<0> is "H", the access control circuit AC outputs the pre-decode signal PD0 that designates the spare area 110 of the memory array ARY1 as an access target.

In the first embodiment, when the number of the defective cells is small, the relief determination circuit RJ1 is inactivated, and the relief determination circuit RJ0 takes charge of coincidence determination for all the relief addresses. So to speak, an "activation control circuit" is formed by the NOR circuit 114, inverter 116 and NAND circuit 118, and the relief determination circuit RJ1 is forcibly inactivated by the "activation control circuit". All the relief addresses are recorded only in the fuse circuit FS0, eliminating the need of scanning the fuse circuit FS1 for the trimming. When the number of the defective cells decreases as a processing technique becomes stable, it is possible to reduce not only the number of times of irradiation of laser beams, but also the number of times of scan operation, contributing to a reduction in the trimming time.

Figure 9:
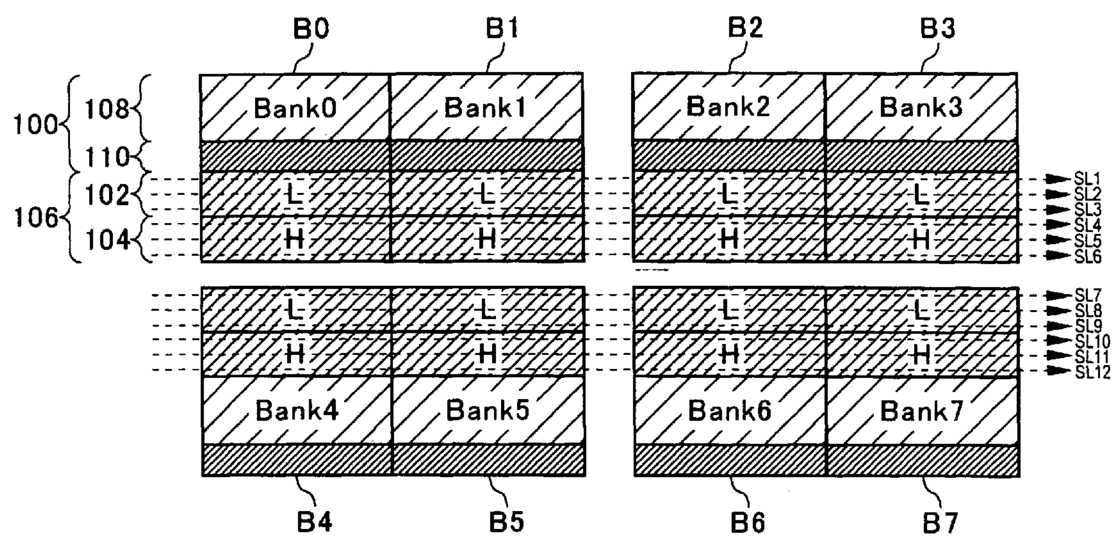
FIG. 9 is a schematic view illustrating the relationship between the bank and relief address storing area in a general DRAM.
Figure 10:
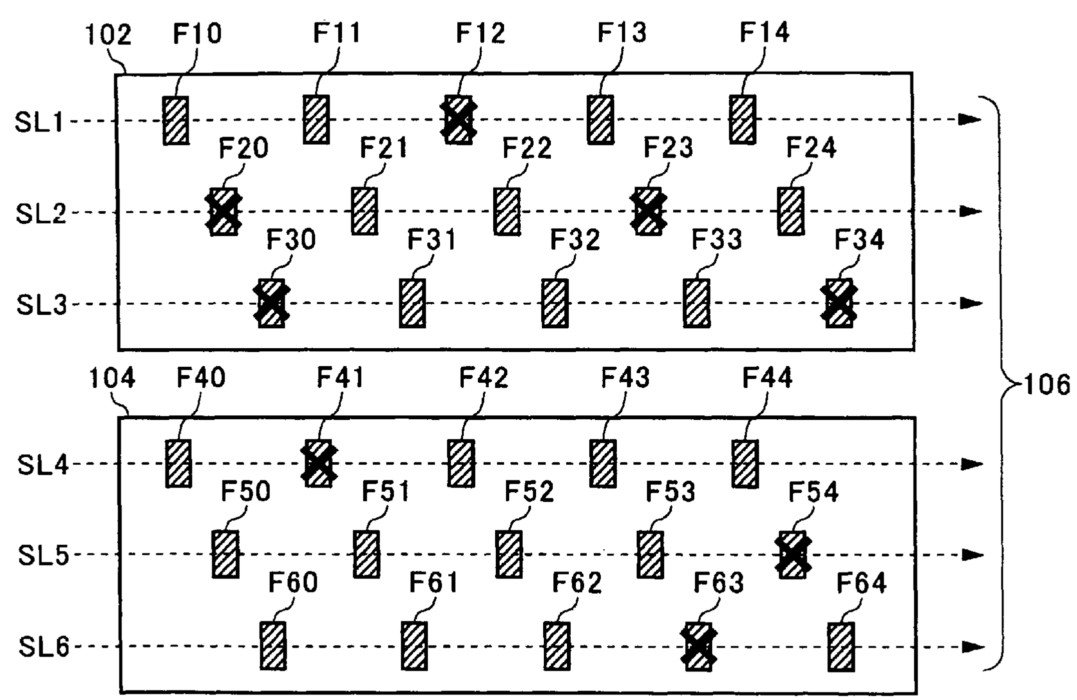
FIG. 10 is an enlarged peripheral view of the relief address storing area illustrated in FIG. 9.

FIG. 2 is a first schematic view illustrating the relationship between the bank and relief address storing area in the first embodiment. In FIG. 2, with respect to all the banks B0 to B7, recording of the relief address is made only to the fuse circuit FS0. In this case, it is not necessary to perform trimming for the fuse circuit FS1 of each of the banks B, so that the number of times of scan operation is six (scan lines 1 to 3 and 10 to 12). Thus, the number of times of scan operation is reduced by half as compared to the general method illustrated in FIG. 9, thereby significantly reducing the trimming time.

Figure 3:
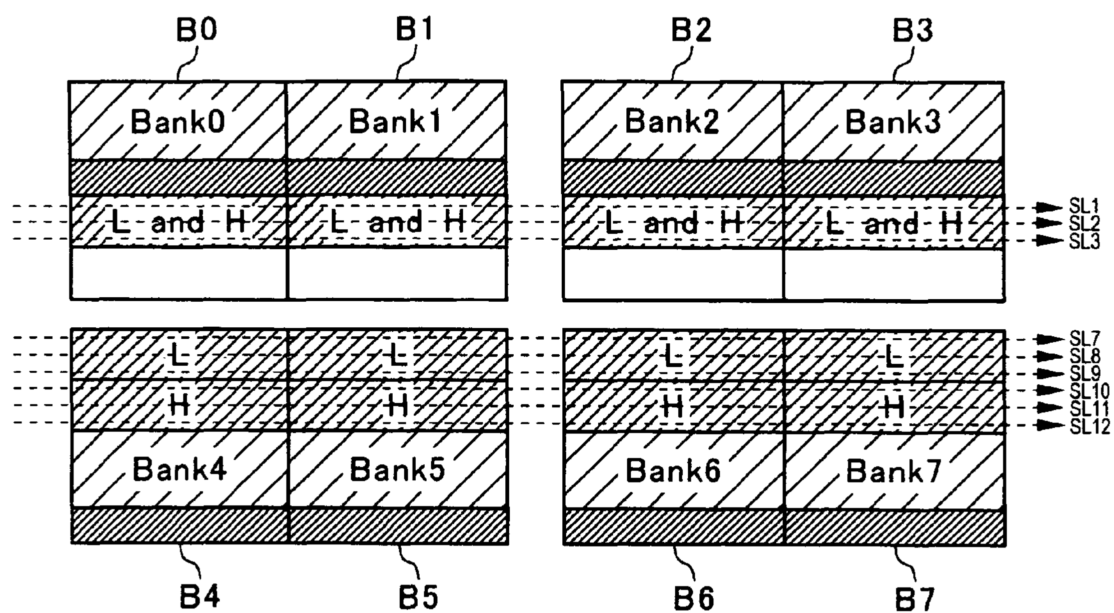
FIG. 3 is a second schematic view illustrating the relationship between the bank and a relief address storing area in the first embodiment.

FIG. 3 is a second schematic view illustrating the relationship between the bank and relief address storing area in the first embodiment. In FIG. 3, with respect to the banks B0 to B3, recording of the relief address is made only to the fuse circuit FS0. In this case, the number of times of scan operation is nine (scan lines 1 to 3 and 7 to 12).

Figure 4:
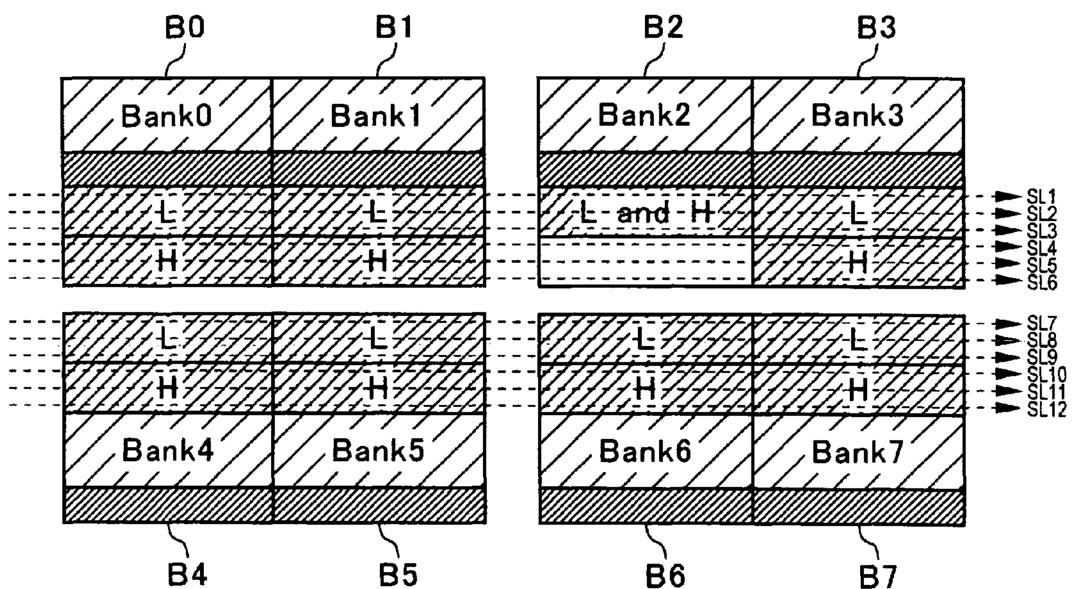
FIG. 4 is a third schematic view illustrating the relationship between the bank and a relief address storing area in the first embodiment.

FIG. 4 is a third schematic view illustrating the relationship between the bank and relief address storing area in the first embodiment. In FIG. 4, with respect to the bank B2, recording of the relief address is made only to the fuse circuit FS0. In this case, although the number of times of scan operation is not reduced, the bank B2 can be skipped in the scan operation for the scan lines SL4 to SL5, thereby reducing the entire trimming time.

Figure 5:
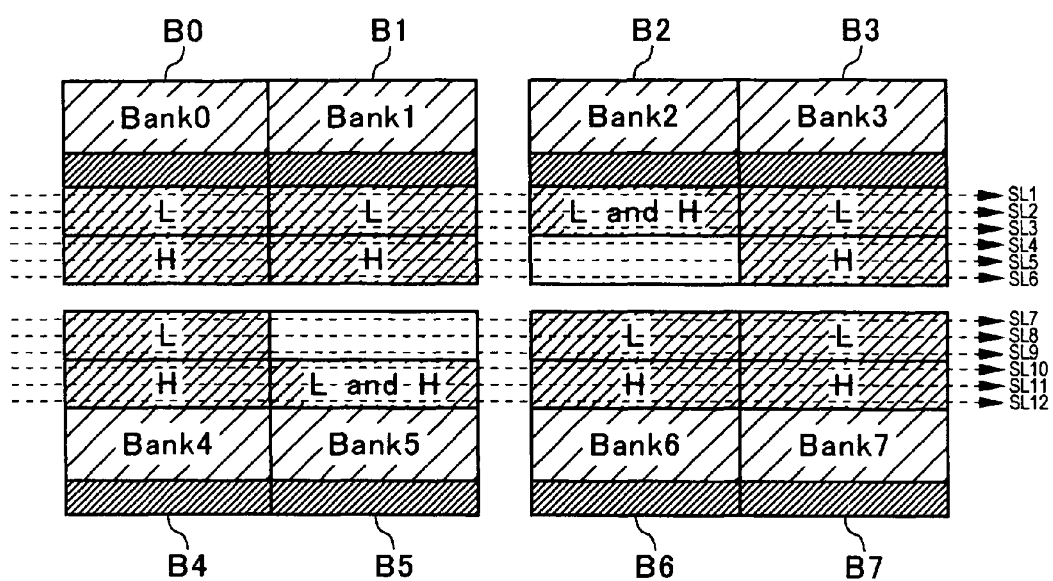
FIG. 5 is a fourth schematic view illustrating the relationship between the bank and a relief address storing area in the first embodiment.

FIG. 5 is a fourth schematic view illustrating the relationship between the bank and relief address storing area in the first embodiment. In FIG. 5, with respect to the banks B2 and B5, recording of the relief address is made only to the fuse circuit FS0.

Figure 6:
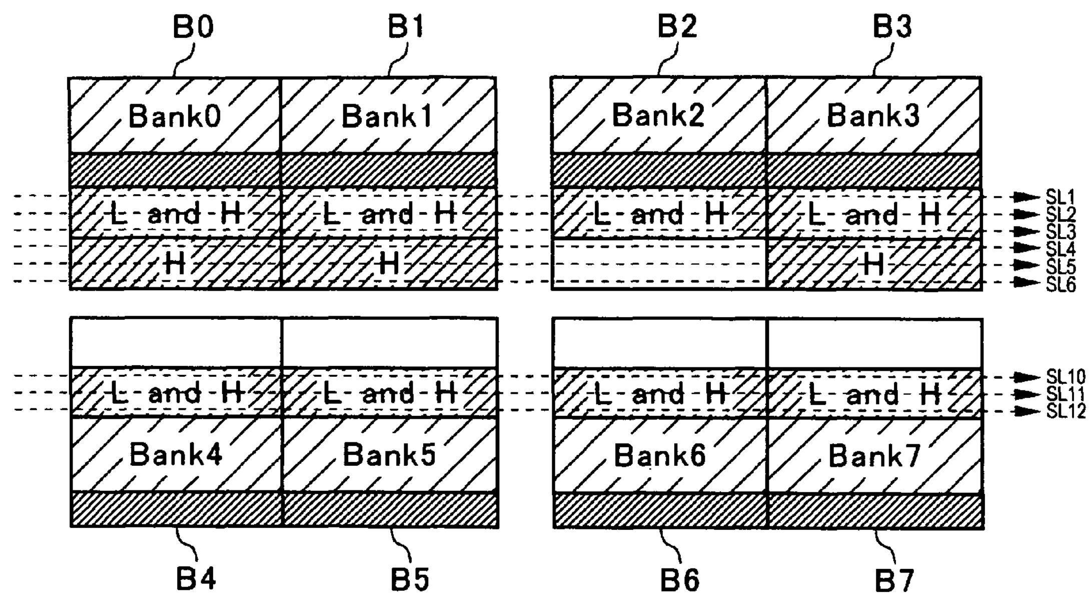
FIG. 6 is a fifth schematic view illustrating the relationship between the bank and a relief address storing area in the first embodiment.

FIG. 6 is a fifth schematic view illustrating the relationship between the bank and relief address storing area in the first embodiment. In FIG. 6, with respect to the banks B2 and B4 to B7, recording of the relief address is made only to the fuse circuit FS0.

Second Embodiment

Figure 7:
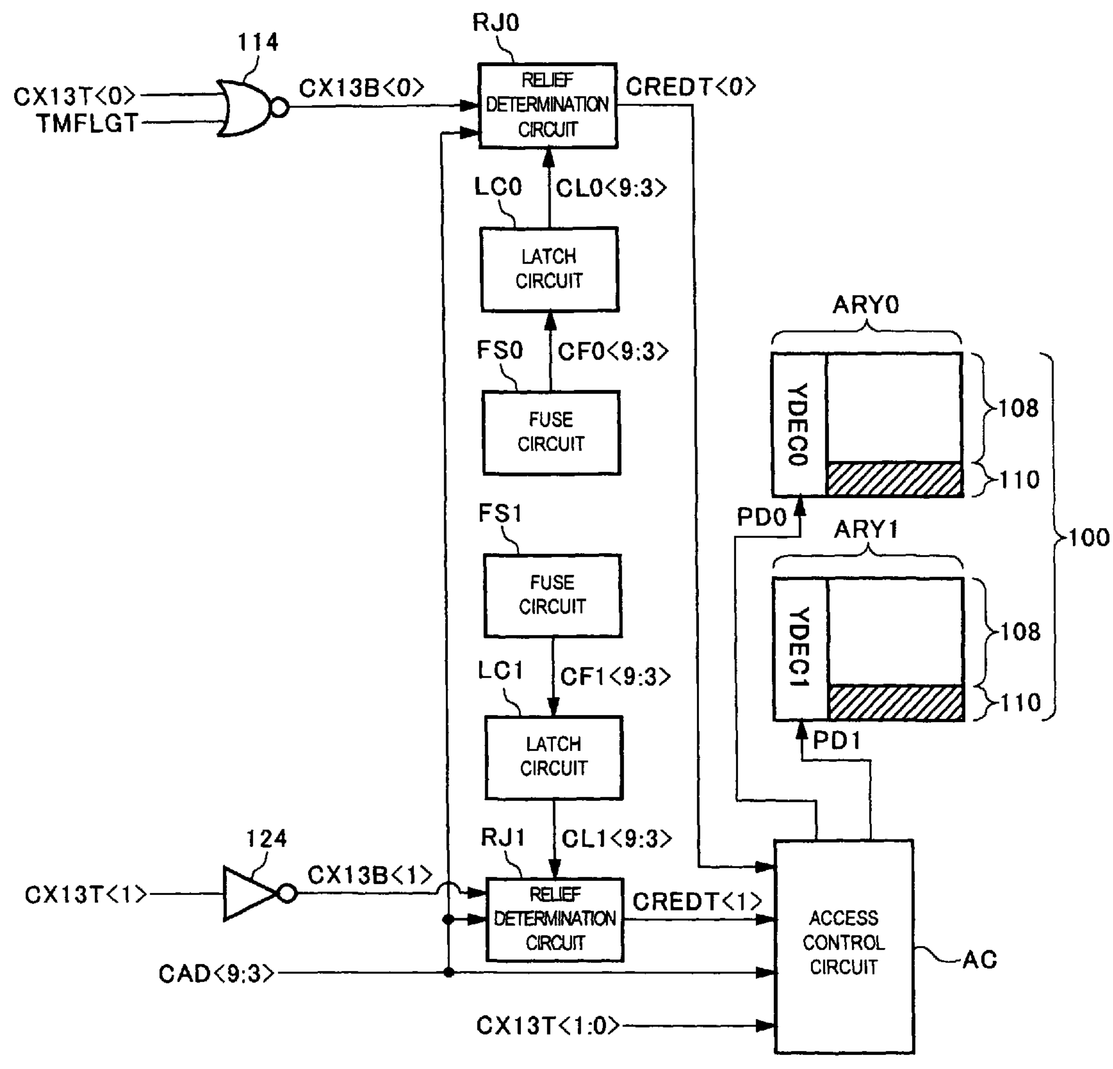
FIG. 7 is a peripheral circuit diagram of the bank of the semiconductor memory device according to a second embodiment of the present invention.

FIG. 7 is a peripheral circuit diagram of the bank B of the semiconductor memory device 10 according to a second embodiment of the present invention. The components designated by the same reference numerals as those in FIG. 1 have the same function as the components illustrated in FIG. 1. The bank B in the second embodiment controls the activation of the relief determination circuits RJ0 and RJ1 by means of the NOR circuit 114 and inverter 124.

Based on the circuit configuration described above, a concrete relief address control method will be described below.

(1) In the Case Where the Number of Relief Addresses is More than a Predetermined Value The lower-address side relief address is recorded in the fuse circuit FS0, and upper-address side relief address is recorded in the fuse circuit FS1. At this time, the TMFLGT is set to "L".

1-1: When the Designation Address is Lower Address (CX13T<0>="H", CX13T<1>="L")

The relief determination circuit RJ0 is activated since the CX13T<0> is "H", while the relief determination circuit RJ1 is inactivated since the CX13T<1> is "L". As a result, the output of the relief determination circuit RJ1 is fixed to CREDT<1>="L". When the designation address is the relief address, the relief determination circuit RJ0 outputs CREDT<0>="H". When the designation address is not the relief address but a normal address, the relief determination circuit RJ0 outputs CREDT<0>="L".

The access control circuit AC outputs, according to the CAD<9:3> and CX13T<1:0>, the pre-decode signal PD0 that designates the regular area 108 of the memory array ARY0 as an access target when the CREDT<0> is "L". When the CREDT<0> is "H", the access control circuit AC outputs the pre-decode signal PD0 that designates the spare area 110 of the memory array ARY0 as an access target.

1-2: When the Designation Address is Upper Address (CX13T<0>="L", CX13T<1>="H")

The relief determination circuit RJ0 is inactivated since the CX13T<0> is "L", while the relief determination circuit RJ1 is activated since the CX13T<1> is "H". As a result, the output of the relief determination circuit RJ0 is fixed to CREDT<1>="L". When the designation address is the relief address, the relief determination circuit RJ1 outputs CREDT<1>="H". When the designation address is not the relief address but a normal address, the relief determination circuit RJ1 outputs CREDT<1>="L".

The access control circuit AC outputs, according to the CAD<9:3> and CX13T<1:0>, the pre-decode signal PD1 that designates the regular area 108 of the memory array ARY1 as an access target when the CREDT<1> is "L". When the CREDT<1> is "H", the access control circuit AC outputs the pre-decode signal PD1 that designates the spare area 110 of the memory array ARY1 as an access target.

(2) In the Case Where the Number of Relief Addresses is Not More Than a Predetermined Value The detected relief addresses are recorded only in the fuse circuit FS0. The TMFLGT is set to "H".

2-1: When the Designation Address is Lower Address (CX13T<0>="H", CX13T<1>="L")

In this case, the relief determination circuit RJ0 is activated, while the relief determination circuit RJ1 is inactivated. The access control circuit AC selects the memory array ARY0 according to CX13T<1:0>. When the designation address is the relief address, the CREDT<0> is set to "H". When the designation address is not the relief address but a normal address, the CREDT<0> is set to "L".

The access control circuit AC outputs, according to the CAD<9:3> and CX13T<1:0>, the pre-decode signal PD0 that designates the regular area 108 of the memory array ARY0 as an access target when the CREDT<0> is "L". When the CREDT<0> is "H", the access control circuit AC outputs the pre-decode signal PD0 that designates the spare area 110 of the memory array ARY0 as an access target.

2-2: When the Designation Address is Upper Address (CX13T<0>="L", CX13T<1>="H")

Since the TMFLGT is "H", the relief determination circuit RJ0 is activated. Further, since the CX13T<1> is "H", the relief determination circuit RJ1 is also activated. The relief determination circuit RJ0 compares the designation address CAD<9:3> included in the upper address side and relief address CL0<9:3> output from the fuse circuit FS0. Since not only the relief addresses in the lower address but also the relief addresses in the upper address are recorded in the fuse circuit FS0, the relief determination circuit RJ0 can determine coincidence/non-coincidence between the designation address and relief address in terms of the upper address side. When the designation address (upper address) is the relief address, the CREDT<0> is set to "H". When the designation address is not the relief address but a normal address, the CREDT<1> is set to "L".

The access control circuit AC selects the CREDT<0> and memory array ARY1 according to the CX13T<1:0>. The CREDT<0> is ignored. That is, at this time, the relief determination circuit RJ1 performs redundant operation. The access control circuit AC outputs the pre-decode signal PD1 that designates the regular area 108 of the memory array ARY1 as an access target when the CREDT<0> is "L". When the CREDT<0> is "H", the access control circuit AC outputs the pre-decode signal PD1 that designates the spare area 110 of the memory array ARY1 as an access target.

Also in the second embodiment, all the relief addresses are recorded only in the fuse circuit FS0, so that even when the relief determination circuit RJ1 operates, it does not perform the coincidence determination. Thus, virtually, the CREDT<1> is fixed to "L". Further, as in the case of the first embodiment, the access control circuit AC can recognize whether as access destination is the memory array ARY0 or ARY1 based on the CX13T<1:0>.

In the second embodiment, the relief determination circuit RJ1 performs redundant operation, so that power consumption increases as compared to the first embodiment. However, an advantage of simplifying the circuit configuration can be obtained.

Third Embodiment

Figure 8:
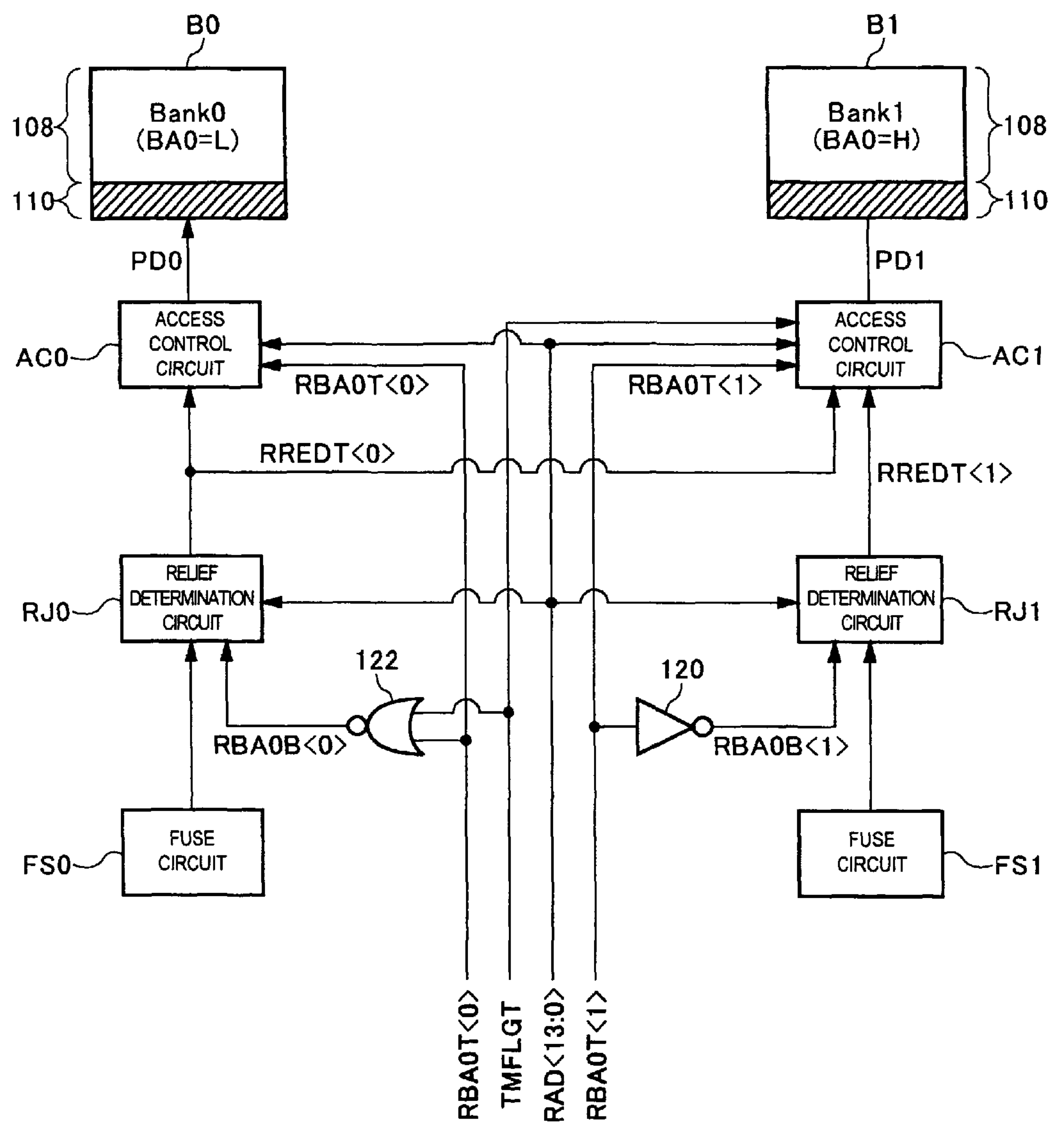
FIG. 8 is a peripheral circuit diagram of the bank of the semiconductor memory device according to a third embodiment of the present invention.

FIG. 8 is a peripheral circuit diagram of the bank of the semiconductor memory device 10 according to a third embodiment of the present invention. The third embodiment relates to an access control method employed in the case where the relief addresses of two banks are collectively recorded in one fuse circuit FS0. The banks B0 and B1 each include a regular area 108 and a spare area 110. Further, the banks B0 and B1 each have an X-decoder (not illustrated) for selecting a row address. The X-decoder of the bank B0 is controlled by a pre-decode signal PD0 of an access control circuit AC0, and X-decoder of the bank B1 is controlled by a pre-decode signal PD1 of an access control circuit AC1.

Data of the relief address read out from the fuse circuit FS0 is supplied to the relief determination circuit RJ0. Data of the relief address read out from the fuse circuit FS1 is supplied to the relief determination circuit RJ1.

RBA0T<1:0> is a two-bit signal indicating the most significant bit of the designation address (row address). In the case where the designation address belongs to the bank B0, the RBA0T<0> and RBA0T<1> are set to "H" and "L", respectively, and in the case where the designation address belongs to the bank B1, the RBA0T<0> and RBA0T<1> are set to "L" and "H", respectively.

The RBA0T<0> signal is input to a two-input NOR circuit 122 and access control circuit AC0. Another input signal of the NOR circuit 122 is a one-bit TMFLGT signal. As in the case of the first embodiment, when the TMFLGT is "L", an output signal RBA0B<0> of the NOR circuit 122 is an inversion signal of the RBA0T<0>. The RBA0T<1> signal is input to an inverter 120 and access control circuit AC1. An output signal RBA0B<1> of the inverter 120 is an inversion signal of the RBA0T<1>.

The relief determination circuit RJ0 is a low-active circuit activated when the RBA0B<0> is "L" and determines coincidence/non-coincidence between the RAD<13:0> and relief address. The RAD<13:0> is a signal corresponding to a row address R13-R0 of the designation address. When the designation address (row address) corresponds to any relief address recorded in the fuse circuit FS0, the relief determination circuit RJ0 outputs RREDT<0>="H" while when the designation address corresponds to none of the relief addresses recorded in the fuse circuit FS0, the relief determination circuit RJ0 outputs RREDT<0>="L".

The relief determination circuit RJ1 is a low-active circuit activated when the RBA0B<1> is "L" and determines coincidence/non-coincidence between the RAD<13:0> and relief address. When the designation address (row address) corresponds to any relief address recorded in the fuse circuit FS1, the relief determination circuit RJ1 outputs RREDT<1>="H" while when the designation address corresponds to none of the relief addresses recorded in the fuse circuit FS1, the relief determination circuit RJ1 outputs RREDT<1>="L".

The access control circuit AC0 is a high-active circuit activated when the RBA0T<0> is "H" and recognizes the destination address based on the RAD<13:0> and selects one of the regular area 108 and spare area 110 according to the RREDT<0>.

The access control circuit AC1 is a high-active circuit activated when the RBA0T<1> is "H" and recognizes the destination address based on the RAD<13:0>. To the access control circuit AC1, the RREDT<0>, RREDT<1>, and TMFLGT are input. When the TMFLGT is "L", the access control circuit AC1 selects one of the regular area 108 and spare area 110 according to the RREDT<1>. When the TMFLGT is "H", the access control circuit AC1 selects one of the regular area 108 and spare area 110 according to the RREDT<0>.

In the initial stage of a processing technique, the TMFLGT is set to "L", and the relief addresses are stored in the fuse circuits FS0 and FS1. When the number of the relief addresses decreases as the processing technique becomes stable, all relief addresses are recorded only in the fuse circuit FS0 while the fuse circuit FS1 is not used. At this time, the TMFLGT is set to "H".

Based on the circuit configuration described above, a concrete relief address control method will be described below.

(1) In the Case Where the Number of Relief Addresses is More than a Predetermined Value The relief addresses of the bank B0 and B1 are recorded in the fuse circuits FS0 and FS1, respectively. At this time, the TMFLGT is set to "L". Since the TMFLGT is set to "L", the relief determination circuit RJ0 is activated when the RBA0B<0> is "L", that is, when the bank B0 is designated. On the other hand, the relief determination circuit RJ1 is activated when the RBA0B<1> is "L", that is, when the bank B1 is designated. Thus, when either one of the relief determination circuits RJ0 and RJ1 is activated, the other one is inactivated by necessity.

1-1: When the Designation Address Belongs to the Bank B0 (RBA0T<0>="H", RBA0T<1>="L")

The relief determination circuit RJ0 and access control circuit AC0 are activated, while the relief determination circuit RJ1 and access control circuit AC1 are inactivated. When the designation address is the relief address, the RREDT<0> is set to "H", while when the designation address is not the relief address but a normal address, the RREDT<0> is set to "L".

The access control circuit AC0 outputs, according to the RAD<13:0>, the pre-decode signal PD0 that designates the regular area 108 of the bank B0 as an access target when the RREDT<0> is "L". When the RREDT<0> is "H", the access control circuit AC0 outputs the pre-decode signal PD0 that designates the spare area 110 of the bank B0 as an access target.

1-2: When the Designation Address Belongs to the Bank B1 (RBA0T<0>="L", RBA0T<1>="H")

The relief determination circuit RJ0 and access control circuit AC0 are inactivated, while the relief determination circuit RJ1 and access control circuit AC1 are activated.

Since the TMFLGT is "L", the access control circuit AC1 recognizes whether the designation address is the relief address or not based on the RREDT<1>. When the designation address is the relief address, the RREDT<1> is set to "H", while when the designation address is not the relief address but a normal address, the RREDT<1> is set to "L". When the RREDT<1> is "L", the access control circuit AC1 outputs the pre-decode signal PD1 that designates the regular area 108 of the bank B1 as an access target according to the RAD<13:0>. When the RREDT<1> is "H", the access control circuit AC0 outputs the pre-decode signal PD1 that designates the spare area 110 of the bank B1 as an access target.

(2) In the Case Where the Number of Relief Addresses is Not More than a Predetermined Value The relief address is recorded only in the fuse circuit FS0. Since the TMFLGT is "H", the relief determination circuit RJ0 is necessarily activated. The relief address is recorded only in the fuse circuit FS0, so that RREDT<1> is fixed to "L".

2-1: When the Designation Address Belongs to the Bank B0 (RBA0T<0>="H", RBA0T<1>="L")

Since the RBA0T<1> is "L", the relief determination circuit RJ1 is inactivated. Since the RBA0T<0> is "H", the access control circuit AC0 is activated, while the access control circuit AC1 is inactivated since the RBA0T<1> is "L". Thus, the access control circuit AC0 accesses the regular area 108 or spare area 110 of the bank B0 according to the RAD<13:0> and RREDT<0>.

2-2: When the designation address belongs to the bank B1 (RBA0T<0>="L", RBA0T<1>="H")

Since the RBA0T<0> is "L", the access control circuit AC0 is inactivated. Since the RBA0T<1> is "H", both the relief determination circuit RJ1 and access control circuit AC1 are activated. Since the TMFLGT is "H", the access control circuit AC1 determines whether an access is made to the regular area 108 or spare area 110 based on the RREDT<0>. That is, although the relief determination circuit RJ1 is activated, a determination result of the relief determination circuit RJ1 has no influence on the control of the access control circuit AC1.

Since the access control circuit AC0 is inactivated, the bank B0 will not be accessed. Not only the relief address of the bank B0, but also the relief address of the bank B1 is recorded in the fuse circuit FS0. The relief determination circuit RJ0 refers to the data of the fuse circuit FS0 and performs the relief address determination also for the designation address (row address) belonging to the bank B1. The access control circuit AC1 accesses the regular area 108 or spare area 110 of the bank B1 according to the RREDT<0> indicating the determination result of the relief determination circuit RJ0.

In the third embodiment, the relief determination circuit RJ0 is forcibly activated by the TMFLGT signal when the number of defective cells is small and takes charge of coincidence determination for all the relief addresses. Further, based on the TMFLGT signal, the access control circuit AC1 determines whether to follow the determination result of the relief determination circuit RJ0 or RJ1. That is, in the third embodiment, the TMFLGT signal functions as the area selection signal. Also in the third embodiment, recording all the relief addresses only in the fuse circuit FS0 eliminates the need of scanning the fuse elements F in the fuse circuit FS1 for the trimming. This contributes to a reduction in the trimming time.

The present invention has been described based on the above embodiments. It should be understood by those skilled in the art that the above embodiments are merely exemplary of the invention, various modifications and changes may be made within the scope of the claims of the present invention, and all such variations may be included within the scope of the claims of the present invention. Thus, the descriptions and drawings in this specification should be considered as not restrictive but illustrative.

The following semiconductor memory device is provided as an aspect of the present invention: "a semiconductor memory device comprising: first and second memory areas each including a regular area and a spare area; first and second relief address storing areas each storing a relief address which is an address included in the regular area and replaced by an address of the spare area; first and second relief determination circuits provided so as to correspond to the first and second relief address storing areas, respectively and each determine whether an input address is the relief address or not; a control circuit that receives a control signal indicating a first status in which the relief addresses are sorted into the first and second relief address storing areas or a second status in which the relief addresses are recorded only in the first relief address storing area and selects, according to the input address, one of the first and second relief determination circuits for the relief address determination when the control signal indicates the first status or selects the first relief determination circuit for the relief address determination irrespective of whether the input address designates the first or second memory area when the control signal indicates the second status; and an access control circuit that selects an access destination corresponding to the input address from the first or second memory area according to determination results of the first and second relief determination circuits."

What is claimed is:

1. A semiconductor memory device comprising:

first and second memory areas each including a regular area and a spare area, the spare area being accessed in place of the regular area when an input address is a relief address;

first and second relief address storing areas each storing relief addresses;

first and second relief determination circuits assigned to the first and second relief address storing areas, respectively and each determine whether the input address is the relief address or not;

an activation control circuit that inactivates the second and relief determination circuit when a relief activation signal inputted to the activation control circuit is a first logic state; and an access control circuit that selects the second memory area and selects the spare area included in the second memory area as an access target when the relief activation signal is the first logic state and the first relief determination circuit determines that the input address is the relief address.

2. The semiconductor memory device as claimed in claim 1, wherein the activation control circuit activates the first and second relief determination circuit when the relief activation signal is a second logic state, and the access control circuit selects one of the first and second memory areas based on an area selection signal and selects the spare area included in the selected memory area as an access target when the relief activation signal is the second logic state and the first or second relief determination circuit determines that the input address is the relief address.

3. The semiconductor memory device as claimed in claim 2, wherein the access control circuit selects one of the first and second memory areas based on the area selection signal and selects the regular area included in the selected memory area as an access target when the first and second relief determination circuits determine that the input address is not the relief address.

4. The semiconductor memory device as claimed in claim 1, wherein the activation control circuit inactivates the second relief determination circuit when number of the relief addresses is less than a predetermined value.

5. The semiconductor memory device as claimed in claim 1, wherein the relief addresses of the first and second memory areas are collectively stored in the first relief address storing area when number of the relief addresses is less than a predetermined value.

6. The semiconductor memory device as claimed in claim 1, wherein the first and second memory areas are included in same bank.

7. The semiconductor memory device as claimed in claim 1, wherein the first and second memory areas belong to different banks.

8. A device comprising:

a first memory area;

a second memory area;

an access control circuit selecting one of the first and second memory areas based on an area selection signal inputted thereto;

a first address storing area storing a first relief address and a second relief address, the first relief address indicating one address in the first memory area, the second relief address indicating another address in the second memory area;

a second address storing area storing no relief address;

a first relief determination circuit assigned to the first address storing area determining whether an input address is the first and second relief addresses or not; and a second relief determination circuit assigned to the second address storing area, the second relief determination circuit being inactivated under an relief activation signal being a first logic state.

9. The device as claimed in claim 8, wherein the first and second memory areas each include a regular area and a spare area, the spare area being accessed in place of the regular area when the input address is the first or second relief address.

10. The device as claimed in claim 8, wherein the first address storing area comprises a plurality of fuse elements.

11. The device as claimed in claim 8, wherein the first logic state of the relief activation signal is generated from the area selection signal.

12. The device as claimed in claim 8, wherein the number of error cells included in the first and second memory areas is less than a storable number of the first address storing area.

13. The device as claimed in claim 8, wherein the first and second memory areas are included in same bank.

14. The device as claimed in claim 8, wherein the first and second memory areas belong to different banks.

* * * * *